United States Patent
Briand et al.

(10) Patent No.: US 10,581,482 B2
(45) Date of Patent: Mar. 3, 2020

(54) METHOD AND SYSTEM FOR CALIBRATING A RADIOFREQUENCY MULTICHANNEL SUBSYSTEM OF A TELECOMMUNICATIONS PAYLOAD

(71) Applicant: THALES, Courbevoie (FR)

(72) Inventors: Aline Briand, Toulouse (FR); Eddy Soulez, Toulouse (FR); Cécile Larue De Tournemine, Toulouse (FR); Walid Karoui, Toulouse (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 16/261,259

(22) Filed: Jan. 29, 2019

(65) Prior Publication Data
US 2019/0238176 A1    Aug. 1, 2019

(30) Foreign Application Priority Data

Feb. 1, 2018   (FR) ...................... 18 00105

(51) Int. Cl.
*H04B 1/7097* (2011.01)
*H04B 1/709* (2011.01)
(Continued)

(52) U.S. Cl.
CPC ............. *H04B 1/7097* (2013.01); *H01Q 3/40* (2013.01); *H03F 3/195* (2013.01); *H03F 3/211* (2013.01);
(Continued)

(58) Field of Classification Search
CPC ...... H04B 1/7097; H04B 17/12; H04B 1/709; H04B 2001/6912; H03F 3/245;
(Continued)

(56) References Cited

U.S. PATENT DOCUMENTS

2010/0156528 A1   6/2010   Couchman et al.
2012/0280748 A1   11/2012  Tronche et al.
(Continued)

FOREIGN PATENT DOCUMENTS

CN    1 547 333 A    11/2004

OTHER PUBLICATIONS

"Payload On-Board self calibration techniques", Thales Alenia Space, Feb. 17, 2014.

*Primary Examiner* — Chieh M Fan
*Assistant Examiner* — Fitwi Y Hailegiorgis
(74) *Attorney, Agent, or Firm* — Baker & Hostetler LLP

(57) ABSTRACT

A method for calibrating a radiofrequency multichannel subsystem of a telecommunications payload includes a step of generating and injecting a calibration signal at one or more input access channel injection points; a step of tapping off the injected and propagated calibration signal at tapping-off points of an access channel at output; and then a step of estimating the amplitude and/or phase differences between the internal channels of the multichannel subsystem on the basis of the calibration signal injected at input, serving as a reference, and of the extracted calibration signal or signals; and then a step of correcting the amplitude and/or phase differences by way of correction means. The injected calibration signal is a chirp signal, formed of a chirp or of a sequence of at least two identical chirps. A calibration system implements the calibration method.

16 Claims, 13 Drawing Sheets

(51) Int. Cl.
    *H04B 17/12*     (2015.01)
    *H01Q 3/40*     (2006.01)
    *H03F 3/68*     (2006.01)
    *H03F 3/195*     (2006.01)
    *H03F 3/21*     (2006.01)
    *H03F 3/24*     (2006.01)
    *H04B 1/69*     (2011.01)

(52) U.S. Cl.
    CPC ............... *H03F 3/245* (2013.01); *H03F 3/68* (2013.01); *H04B 1/709* (2013.01); *H04B 17/12* (2015.01); *H04B 2001/6912* (2013.01)

(58) Field of Classification Search
    CPC . H03F 3/211; H03F 3/195; H03F 3/68; H01Q 3/40
    USPC .......................................................... 375/139
    See application file for complete search history.

(56) References Cited

U.S. PATENT DOCUMENTS

| | | |
|---|---|---|
| 2014/0354355 A1 | 12/2014 | Moreau |
| 2015/0249462 A1 | 9/2015 | Chang |
| 2016/0259032 A1* | 9/2016 | Hehn .................... G01S 5/0289 |
| 2017/0222712 A1* | 8/2017 | Chang ................ H04B 7/18506 |

* cited by examiner

METHOD AND SYSTEM FOR CALIBRATING A RADIOFREQUENCY MULTICHANNEL SUBSYSTEM OF A TELECOMMUNICATIONS PAYLOAD

CROSS-REFERENCE TO RELATED APPLICATIONS

This application claims priority to foreign French patent application No. FR 1800105, filed on Feb. 1, 2018, the disclosure of which is incorporated by reference in its entirety.

FIELD OF THE INVENTION

The present invention relates to an embedded method for calibrating a radiofrequency multichannel subsystem of a payload, in particular of a flexible telecommunications payload, or any other payload embedding a subsystem requiring a plurality of radiofrequency channels to be amplitude-matched/phase-matched with one another.

The technical field relates to the embedded calibration of radiofrequency multichannel subsystems used in flexible telecommunications payloads, and more particularly to the calibration of semi-active or active transmission Tx or reception Rx antennas, which are divided notably into the types DRA (direct radiating array), AFSRA (array-fed shaped reflector antenna) and FAFR (focal array-fed reflector), or distributed power radiofrequency amplification sections MPA (multi-port amplifiers), formed by a plurality of power amplifiers, called TWTAs (for travelling-wave tube amplifiers) when they use travelling-wave tubes (TWTs) and called SSPAs (solid-state power amplifiers) when they use solid-state power components.

BACKGROUND

Payloads use the active transmission Tx and/or reception Rx antennas and use distributed power radiofrequency amplification sections MPA to flexibly distribute a plurality of transmission channels to a plurality of output beams.

It is still currently being sought to improve existing solutions for calibrating such radiofrequency multichannel subsystems, the calibration taking place while the satellite is operating, at particular times over the lifetime of said multichannel subsystems in which the performance in terms of amplitude and phase difference between channels will have drifted excessively with respect to a required need, due for example to a change in external temperature conditions that are applied to the multichannel subsystems or to the ageing of their internal components.

The underlying problem of calibrating such multichannel subsystems is that of performing accurate calibration of the multichannel subsystem while it is transmitting operational communications carriers, that is to say achieving the desired amplitude matching and phase matching of the channels with one another with sufficient accuracy, while at the same time ensuring that the ongoing communications are maintained and their transmission quality is upheld.

To this end and as is known, patent application US 2012/0280748 A1, forming a first document, describes a multiport distributed amplification device that is compensated in the presence of traffic.

According to a first preferred embodiment, the multiport distributed amplification device that is compensated in the presence of traffic is configured so as to inject an unmodulated reference signal that is transmitted on a single carrier frequency. The value of this carrier frequency is chosen such that the reference signal is introduced between two communication channels without altering the performance thereof.

According to a second embodiment and as a variant, the unmodulated reference signal transmitted on a single carrier of the first embodiment is replaced with a spread-spectrum sinusoidal reference signal spread by way of a spreading code. In this case, the device for measuring the spread signal includes, in addition to the components that are used by the module for measuring the unmodulated signal, a module for despreading the received signal on the basis of the spreading code that is used, which is supplied by a spreading code generator.

According to the multiport distributed amplification device of the first document, the position of the reference signal to be injected into the guard bands between the traffic carriers depends on the frequency plan of the traffic carriers that originates from the telecommunications missions planning, this lacking flexibility.

In addition, the proposed waveforms for the calibration or reference signal to be injected, such as described in the first document for the spread-spectrum calibration, that is to say that of an unmodulated simple sinusoidal signal CW or that of a sinusoidal signal, spread by way of a spreading code, do not allow the reference signal to be injected into a useful traffic carrier in all cases of configuration of the useful traffic carrier, for example a high-order modulation carrier that is more sensitive to noise or with a high signal-to-noise ratio, or in cases in which the calibration time has to be limited. Specifically, the required power of the calibration signal, which has to be low enough so as not to disrupt transmission of the useful carrier within which it is situated, in order to comply for example with the quasi error-free packet error rate performance criterion of $10^{-7}$ for modulated useful carriers coded using DVB-S2, does not make it possible to estimate inter-channel amplitude and phase disparities with sufficient accuracy.

As is known, patent application US 2014/0354355 A1, forming a second document, describes a multiport distributed amplification device MPA configured so as to maximize isolation between its outputs by implementing a calibration method.

The calibration method uses the traffic signal itself to calibrate the channels of the MPA, but does not use any dedicated calibration signal that has an adapted waveform and is injected into at least one of the channels of the MPA.

If traffic carriers are utilized through frequency reuse in the MPA, degradation of the signal-to-noise ratio of one of these carriers at output of the MPA, caused by aggregated isolation leakages of the other co-frequency carriers, may give rise to dispersive or even erroneous estimations of the inter-channel amplitude and phase differences, leading to an incorrect calibration.

Furthermore, upon each acquisition of the traffic signal on an output of the MPA, the corresponding traffic signal at input of the MPA has to be acquired simultaneously so as to be able to be compared or correlated with the traffic signal at output. The solution described in the second document thus requires the use of a number of analogue-to-digital converters (ADC) twice that which is necessary in a conventional calibration system, such as that described in the first document.

Thus, the calibration systems and methods described in the first and second documents exhibit defects or drawbacks linked to operational constraints, notably with respect to frequency planning of the traffic, or linked to inter-channel error estimation performance limitations.

A calibration method and system that perform accurate calibration of the multichannel subsystem while it is transmitting operational communications carriers and that avoid the drawbacks of the systems of the abovementioned first and second documents are sought. The method and the system should make it possible to obtain the desired amplitude matching and phase matching of the channels with one another with sufficient accuracy, while at the same time ensuring that the ongoing communications are maintained and their transmission quality is upheld.

The calibration of the multichannel subsystem should be able to be performed in narrowband, for example over 41 MHz in the L band, but also over a wide frequency band, for example over 2 GHz in the Ku band or over 2.9 GHz in the Ka band.

SUMMARY OF THE INVENTION

The technical problem is that of providing a method and a system for calibrating an RF multichannel subsystem of a telecommunications payload that make it possible to perform accurate calibration of the multichannel subsystem, at the same time as the transmission of the traffic carriers, which is not detrimental to the frequency band used by the traffic carriers, and is independent of the frequency position of the traffic carriers.

To this end, one subject of the invention is a method for calibrating a radiofrequency multichannel subsystem of a telecommunications payload, the payload being contained entirely within and embedded on board a satellite or distributed on a satellite and a beamforming ground station, the calibration taking place while the payload is operating. The multichannel subsystem comprises: a first integer N, greater than or equal to 2, of access channels at input, and a second integer M, greater than or equal to 1, of access channels at output, and a set of at least two internal channels, each formed of a chain of radiofrequency components having the same architecture, either distributing one and the same input signal, supplied by an access channel at input, to a plurality of access channels at output, or concentrating a plurality of input signals, supplied respectively by a plurality of access channels at input, to one and the same access channel at output. The calibration method comprises:

a first step of generating and injecting a calibration signal at a predetermined injection point of an input access channel or at a plurality of predetermined points each associated with a different input access channel, and then a second step of extracting the injected and propagated calibration signal at a predetermined tapping-off point of an output access channel or at a plurality of predetermined tapping-off points each associated with a different output access channel, and then a third step of estimating the amplitude and/or phase differences between the internal channels of the multichannel subsystem on the basis of the calibration signal injected at input, serving as a reference, and of the extracted calibration signal or signals; and then a fourth step of correcting the amplitude and/or phase differences by way of one or more means for correcting said differences when one or more of said differences exceed a predetermined threshold.

The calibration method is characterized in that the injected calibration signal is a chirp signal, formed of a chirp or of a sequence of at least two identical chirps.

According to particular embodiments, the method for calibrating a radiofrequency multichannel subsystem comprises one or more of the following features, taken alone or in combination:

each chirp of the injected chirp calibration signal is a complex signal s(t) of the form $s(t)=a(t)\cdot\exp\{j\cdot\varphi(t)\}$, where $a(t) \geq 0$ is a low-pass amplitude whose temporal evolution is slow in comparison with the oscillations of the phase $\varphi(t)$;

the injected calibration signal is a periodized complex linear chirp signal s(t) of the form $s(t)=A\cdot\exp\{j\cdot\varphi(t)\}$, the instantaneous frequency:

$$f(t) = \frac{1}{2\pi} * \frac{d\varphi(t)}{dt} = F1 + \frac{F2-F1}{T1} * t$$

evolving in line with a sawtooth periodic function repeating, in a time period T1, a frequency ramp pattern varying linearly between a first frequency value F1 and a second frequency value F2, the first frequency value F1 being equal to $$F_{ce} - \frac{BW_{chirp}}{2}$$

and the second frequency value F2 being equal to $$F_{ce} + \frac{BW_{chirp}}{2},$$

$F_{ce}$ denoting a predetermined centre frequency and $BW_{chirp}$ denoting the bandwidth of the chirp;

the frequency position of the injected chirp calibration signal is independent of the frequency plan of the traffic carriers;

the spectrum of the injected chirp calibration signal contains a main lobe that has a bandwidth $B_{chirp}$ and that is contained entirely within the band of a traffic carrier;

the spectrum of the injected chirp calibration signal contains a main lobe that has a bandwidth $B_{chirp}$ and that is contained partly within the band of a traffic carrier;

the spectrum of the injected chirp calibration signal contains a main lobe that has a bandwidth $B_{chirp}$ and that is contained entirely within a guard band of the traffic carriers;

the first step consists in generating and injecting calibration signals at a predetermined injection point of an input access channel or at a plurality of predetermined points each associated with a different input access channel, and the injected calibration signals are chirp signals having the same bandwidth and centred on different centre frequencies that are distributed evenly over the communication band of the traffic carriers;

during the third step, the method for estimating the amplitude and/or phase differences between the internal channels of the multichannel subsystem on the basis of the calibration signal injected at input, serving as a reference, and of the signal or signals tapped off at output uses a second-type algorithm based on correlation-matched filtering;

the injected calibration signal is a periodized complex linear chirp signal s(t) of the form $s(t)=A\cdot\exp\{j\cdot\varphi(t)\}$, the instantaneous frequency f(t), expressed by the equations:

$$f(t) = \frac{1}{2\pi} * \frac{d\varphi(t)}{dt} = F1 + \frac{F2-F1}{T1} * t$$

evolving in line with a sawtooth periodic function repeating, in a time period T1, a frequency ramp pattern varying linearly between a first frequency value F1 and a second frequency value F2, the first frequency value F1 being equal to $$F_{ce} - \frac{BW_{chirp}}{2}$$

and the second frequency value F2 being equal to $$F_{ce} + \frac{BW_{chirp}}{2},$$

$F_{ce}$ denoting a predetermined centre frequency and $BW_{chirp}$ denoting the bandwidth of the chirp; and during the third step, the amplitude ΔA and/or phase ΔPhi differences between the internal channels of the multichannel subsystem are estimated on the basis of the calibration signal injected at input, serving as a reference, and of the signal or signals tapped off at output, by extracting, for each internal channel, the calibration signal from the traffic signal by way of matched filtering that maximizes the signal-to-noise ratio of the calibration signal and that maximizes a correlation function between the samples of the signal tapped off at output and the samples of the calibration signal as a reference replica, and by estimating the amplitude A and the phase Phi of each internal channel on the basis of the correlation maximum that gives the complex gain and propagation delay of the calibration signal from its digital injection point to the output of the matched filtering; and then by calculating the differences ΔA/ΔPhi of the internal channels in relation to a predetermined reference channel on the basis of the estimated amplitude and phase A/Phi of each channel;

when the telecommunication payload is contained entirely within and embedded on board a satellite, the radiofrequency multichannel system is an MPA including two Butler matrices, with the digital or analogue input Butler matrix, without a beamforming network BFN, integrated into an active or inactive antenna; or an MPA with a beamforming network BFN at digital or analogue input and a Butler matrix at output, integrated into an active or inactive antenna; or a multiport parallelized amplifier MPPA including parallelized amplifiers inside an MPA, integrated into an active or inactive antenna; or what is called a multimatrix semi-active antenna with a reflector, with or without MPA; or a direct radiation array DRA active antenna or an array-fed shaped reflector antenna AFSRA or a focal array-fed reflector FAFR antenna with an analogue or digital BFN; or an on-board function requiring amplitude matching/phase matching of a plurality of channels with one another; and when the telecommunication payload is distributed on a satellite and a beamforming ground station, the radiofrequency multichannel system is a satellite active antenna in reception mode Rx with ground-based beamforming GBBF; or a satellite active antenna in transmission mode Tx with ground-based beamforming GBBF, with or without an MPA or MPPA function entirely on board or with or without an MPA or MPPA function whose input Butler matrix is distributed on the ground;

the fourth step is executed directly on board the satellite or on the ground.

Another subject of the invention is a system for calibrating a radiofrequency multichannel subsystem of a telecommunications payload, the payload being contained entirely within and embedded on board a satellite or distributed on a satellite and a beamforming ground station, the calibration taking place while the payload is operating.

The multichannel subsystem comprises a first integer N, greater than or equal to 2, of access channels at input, and a second integer M, greater than or equal to 2, of access channels at output, and a set of at least two internal channels, each formed of a chain of radiofrequency components having the same architecture, either distributing one and the same input signal, supplied by an access channel at input, to a plurality of access channels at output, or concentrating a plurality of input signals, supplied respectively by a plurality of access channels at input, to one and the same access channel at output.

The calibration system comprises a first device for injecting an analogue or digital calibration signal at a predetermined injection point of an input access channel or at a plurality of predetermined points each associated with a different input access channel; and a second device for tapping off the injected and propagated calibration signal at a predetermined tapping-off point of an output access channel or at a plurality of predetermined tapping-off points each associated with a different output access channel; and a third digital computing device formed of one or more electronic computers and configured so as to: generate a digital calibration signal corresponding to the digital or analogue version of the calibration signal injected by the first device; and extract the injected calibration signal from the signal or signals tapped off at the predetermined tapping-off point of an output access channel or at the predetermined tapping-off points each associated with a different output access channel and from the generated calibration signal; estimate amplitude and/or phase differences between the internal channels of the multichannel subsystem on the basis of the calibration signal injected at input, serving as a reference, and of the extracted calibration signal or signals; and correct amplitude and/or phase differences by controlling one or more means for correcting said differences when one or more of said differences exceed a predetermined threshold. The calibration system is characterized in that the injected calibration signal is a chirp signal.

According to particular embodiments, the system for calibrating a multichannel subsystem comprises one or more of the following features, taken alone or in combination:

the injected calibration signal is a periodized complex linear chirp signal s(t) of the form s(t)=A·exp{j·φ(t)}, the instantaneous frequency f(t), defined by the equations:

$$f(t) = \frac{1}{2\pi} * \frac{d\varphi(t)}{dt} = F1 + \frac{F2-F1}{T1} * t,$$

evolving in line with a sawtooth periodic function repeating, in a time period T1, a frequency ramp pattern varying linearly between a first frequency value F1 and a second frequency value F2, the first frequency value F1 being equal to $$F_{ce} - \frac{BW_{chirp}}{2}$$

and the second frequency value F2 being equal to $$F_{ce} + \frac{BW_{chirp}}{2},$$

$F_{ce}$ denoting a predetermined centre frequency and $BW_{chirp}$ denoting the bandwidth of each of the chirps; and the frequency position of the injected chirp calibration signal is independent of the frequency plan of the traffic carriers;

the first and second devices are configured so as to generate and inject calibration signals at a predetermined injection point of an input access channel or at a plurality of predetermined points each associated with a different input access channel, and the injected calibration signals are chirp signals having the same bandwidth and centred on different centre frequencies that are distributed evenly over the communication band of the traffic carriers;

when the telecommunication payload is contained entirely within and embedded on board a satellite, the radiofrequency multichannel system is an MPA including two Butler matrices, with the digital or analogue input Butler matrix, without a beamforming network BFN, integrated into an active or inactive antenna; or an MPA with a beamforming network BFN at digital or analogue input and a Butler matrix at output, integrated into an active or inactive antenna; or a multiport parallelized amplifier MPPA including parallelized amplifiers inside an MPA, integrated into an active or inactive antenna; or what is called a multimatrix semi-active antenna with a reflector, with or without MPA; or a direct radiation array DRA active antenna or an array-fed shaped reflector antenna AFSRA or a focal array-fed reflector FAFR antenna with an analogue or digital BFN; or an on-board function requiring amplitude matching/phase matching of a plurality of channels with one another; and when the telecommunication payload is distributed on a satellite and a beamforming ground station, the radiofrequency multichannel system is a satellite active antenna in reception mode Rx with ground-based beamforming GBBF, or a satellite active antenna in transmission mode Tx with ground-based beamforming GBBF, with or without an MPA or MPPA function entirely on board or with or without an MPA or MPPA function whose input Butler matrix is distributed on the ground.

BRIEF DESCRIPTION OF THE DRAWINGS

The invention will be better understood upon reading the following description of several embodiments, this description being given solely by way of example and with reference to the drawings, in which.

DETAILED DESCRIPTION

Figure 1:
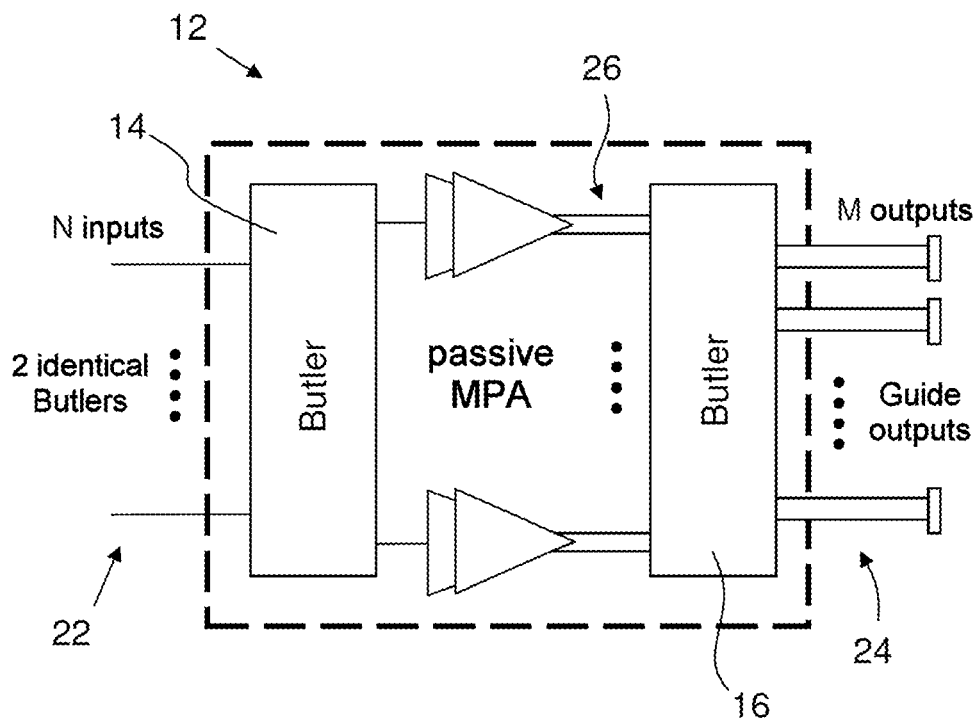
FIG. 1 is a view of a first example of a multichannel subsystem, an MPA said to be passive with reference to the passive Butler matrices that are used therein, which forms part of a telecommunications payload embedded on board a satellite and is advantageously able to be calibrated by a calibration system and method according to the invention.

The basic concept of the invention lies in using a calibration signal dedicated to the calibration function and in the conventional implementation of the following four steps of:

injecting a calibration signal at one or more precise injection points of a radiofrequency multichannel subsystem of a telecommunications payload, and extracting this calibration signal at one or more tapping-off and output points of said subsystem to be calibrated, and estimating amplitude and/or phase differences between the internal channels of the subsystem, and possibly correcting amplitude and/or phase differences using adapted electronic means, for example means having a digital phase shifter function and implemented in one of the apparatuses of the multichannel subsystem. These corrections may alternatively be defined on the ground on the basis of the estimations of the amplitude/phase differences calculated on board and transmitted to the ground, and then applied on board.

The basic concept of the invention lies in the ability of the calibration system to calibrate a multichannel subsystem with a calibration signal that may be "embedded" in a traffic carrier, which may have a position independent of the frequency plan of the traffic carriers, and which makes it possible to obtain, at the same time, the required quality of the calibration performance and lack of degradation of the transmission quality of a traffic carrier, possibly subjected to interference by the calibration signal.

The basic concept of the invention is based on the particular nature of the waveform of the calibration signal that is used, which is that of a chirp signal, associated with a specific processing operation on this chirp signal. The calibration signal may thus be situated anywhere in the frequency band allocated to the telecommunication service of the payload, in particular in a traffic carrier that in this case interferes with the calibration signal.

The calibration system and method according to the invention are configured so as to calibrate a wide family of radiofrequency multichannel subsystems, each forming part of a telecommunications payload.

The function of the multichannel subsystem may be contained entirely within and embedded on board the payload of a satellite, or may be distributed on a satellite and a beamforming ground station, the calibration taking place while the payload is operating.

Generally speaking, a multichannel subsystem calibrated by a calibration system according to the invention comprises:

a first integer N, greater than or equal to 2, of access channels at input, and a second integer M, greater than or equal to 2, of access channels at output, and a set of at least two internal channels, each formed of a chain of radiofrequency components having the same architecture, either distributing one and the same input signal, supplied by an access channel at input, to a plurality of access channels at output, or concentrating a plurality of input signals, supplied respectively by a plurality of access channels at input, to one and the same access channel at output.

When the function of the multichannel subsystem is contained entirely within and embedded on board the payload of a satellite, the radiofrequency multichannel system is:

an MPA including two Butler matrices, with the digital or analogue input Butler matrix, without a beamforming network BFN, integrated into an active or inactive antenna; or an MPA with a beamforming network BFN at digital or analogue input and a Butler matrix at output, integrated into an active or inactive antenna; or a multiport parallelized amplifier MPPA including parallelized amplifiers inside an MPA, integrated into an active or inactive antenna; or a direct radiation array DRA active antenna or an array-fed shaped reflector antenna AFSRA or a focal array-fed reflector FAFR antenna with an analogue or digital BFN; or what is called a multimatrix semi-active antenna with a reflector, with or without MPA; or any other on-board function of a telecommunications, observation, navigation, etc. satellite that would require amplitude matching/phase matching of a plurality of channels with one another, in particular one not mentioned in this document.

According to FIG. 1 and a first example of a multichannel subsystem, a passive MPA 12, forming part of a telecommunications payload embedded on board a satellite, includes two Butler matrices 14, 16 without a beamforming network BFN, a set 22 of N access channels at input, a set 24 of M access channels at output and a set 26 of at least two internal channels, which are formed here by amplification chains. When the Butler matrices have the same number of inputs as outputs, M is equal to N.

Figure 2:
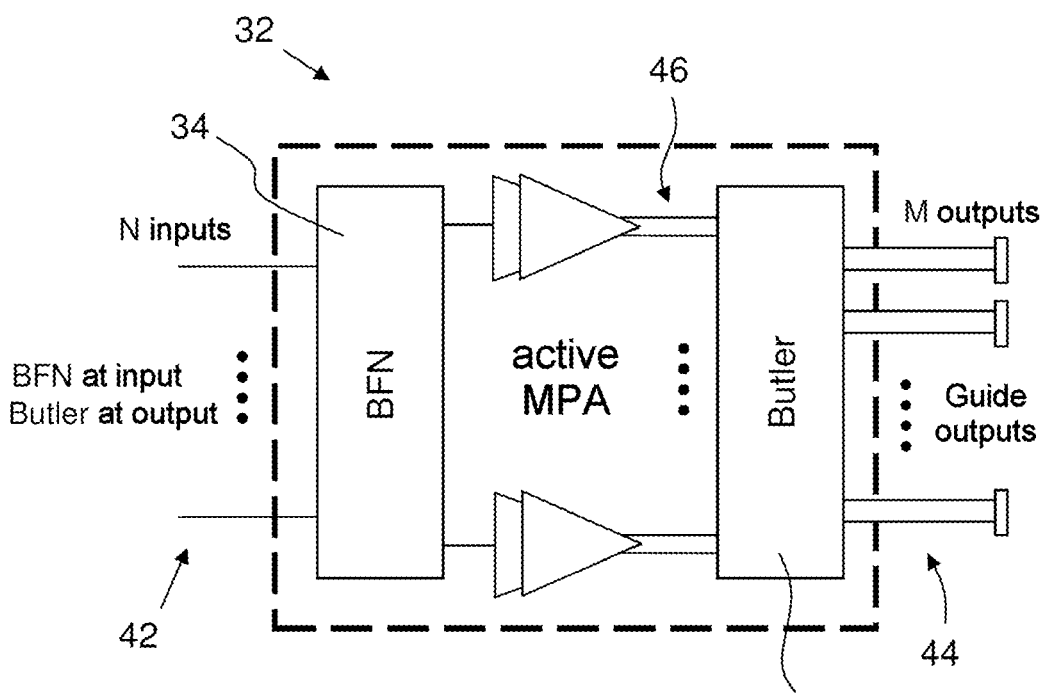
FIG. 2 is a view of a second example of a multichannel subsystem, an MPA said to be active with reference to an analogue or digital active matrix (or BFN) for loading amplitude and phase laws to each channel of each beam, which forms part of a telecommunications payload embedded on board a satellite and is advantageously able to be calibrated by a calibration system and method according to the invention.

According to FIG. 2 and a second example of a multichannel subsystem, an active MPA 32, forming part of a telecommunications payload embedded on board a satellite, includes a digital or analogue beamforming network BFN 34 at input, a Butler matrix 36 at output, a set 42 of N access channels at input, a set 44 of M access channels at output and a set 46 of at least two internal channels, which are formed here by amplification chains.

Figure 3:
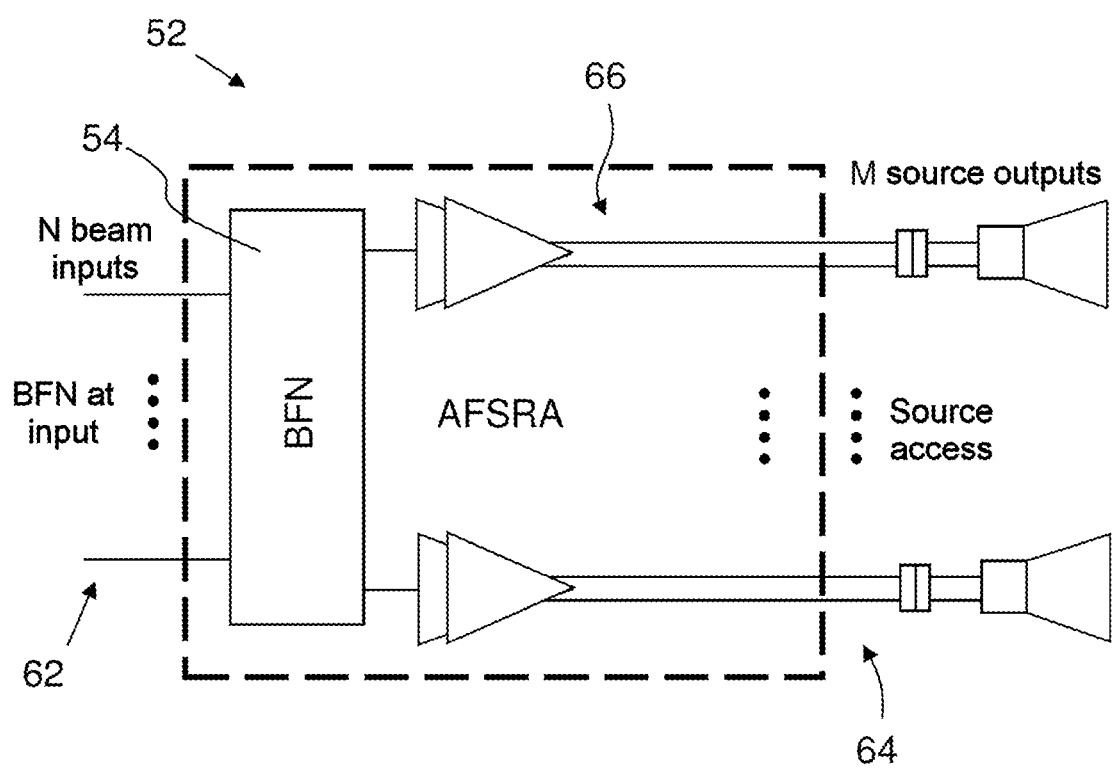
FIG. 3 is a view of a third example of a radiofrequency multichannel subsystem, an active array-fed shaped reflector antenna AFSRA in transmission mode Tx, which forms part of a telecommunications payload embedded on board a satellite and is advantageously able to be calibrated by a calibration system and method according to the invention.

According to FIG. 3 and a third example of a radiofrequency multichannel subsystem, an active array-fed shaped reflector antenna AFSRA 52 in transmission mode Tx, forming part of a telecommunications payload embedded on board a satellite, includes an analogue or digital Tx beamforming network BFN 54, a set 62 of N access channels at input, a set 64 of M access channels at output and a set 66 of at least two internal channels, which are formed in this case by RF power amplification chains.

When the function of the multichannel subsystem is distributed on the telecommunications payload on board a satellite and on a beamforming ground station, the radiofrequency multichannel system is:

a satellite active antenna in reception mode Rx with ground-based beamforming GBBF; or a satellite active antenna in transmission mode Tx with ground-based beamforming GBBF with or without an MPA or MPPA function entirely on board or with or without an MPA or MPPA function whose input Butler matrix is distributed on the ground.

Figure 4:
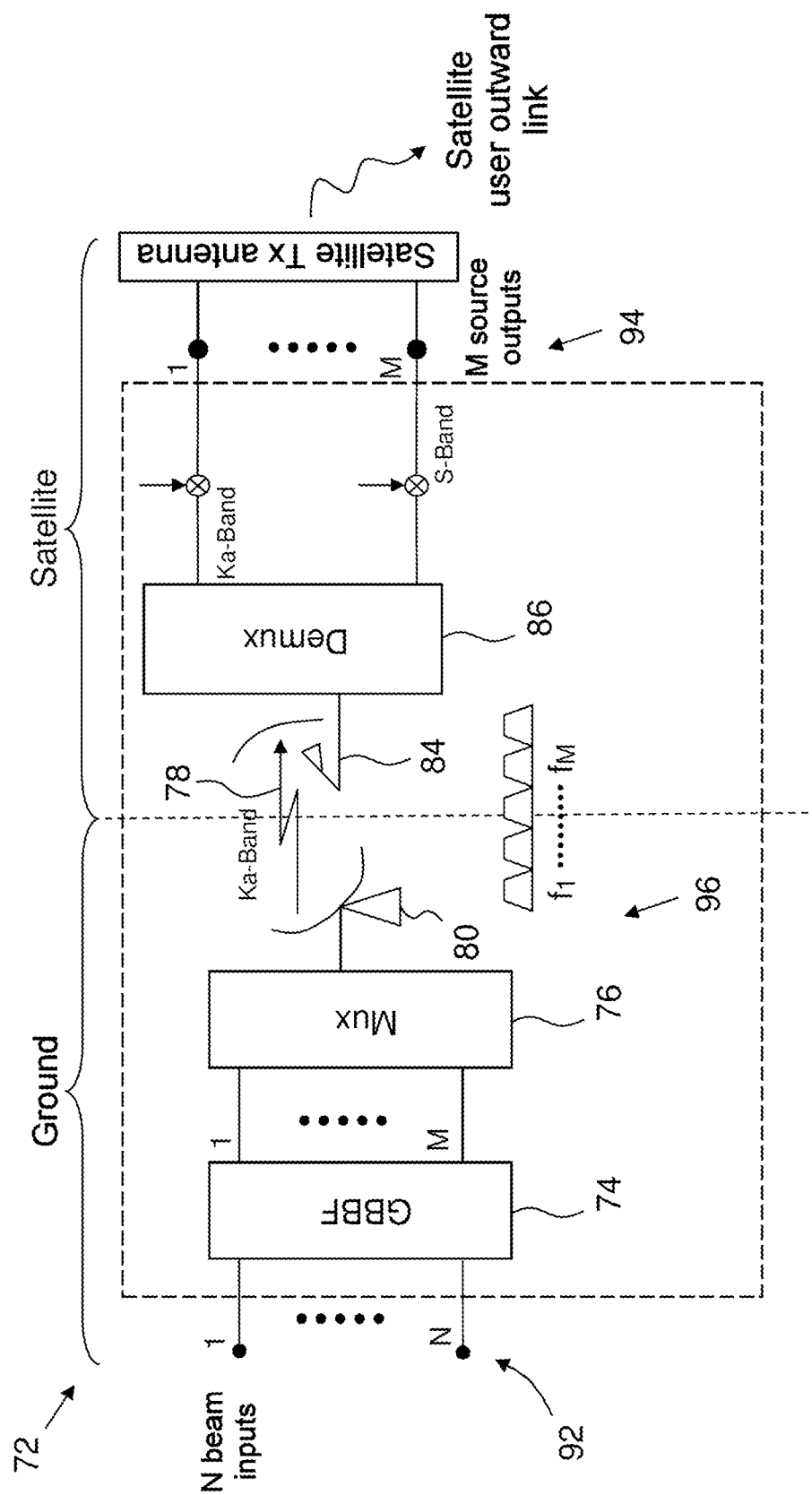
FIG. 4 is a view of a fourth example of a radiofrequency multichannel subsystem, an outward-channel active antenna that forms part of a multibeam telecommunications payload distributed on a satellite and a beamforming ground station and is advantageously able to be calibrated by a calibration system and method according to the invention.

According to FIG. 4 and a fourth example of a radiofrequency multichannel subsystem, an active antenna 72 in transmission mode Tx on the outward channel forms part of a multibeam telecommunications payload by being distributed on a satellite and a GBBF beamforming ground station, and comprises:

on the ground, a GBBF beamforming module 74, a multiplexer 76 for concentrating the output channels of the GBBF module 74, and a transmission Tx RF transmitter antenna assembly 80, configured so as to transmit the multiplex stream to the satellite on a high-bit rate RF link 78;

on the satellite, an RF receiver antenna assembly 84 for the RF reception of the multiplex stream, a demultiplexer 86 for demultiplexing the multiplex stream into source channels intended to feed the multibeam Tx antenna;

on the ground, a set 92 of N access channels at input for beams of the multibeam active Tx antenna, and, on the satellite, a set 94 of M access channels at output, connected to the sources of the multibeam Tx antenna;

a set 96 of at least two internal channels, formed in this case by the GBBF module 74, the multiplexer 76, the transmission Tx RF transmitter antenna assembly 80, the single-beam high-bit rate RF uplink 78, the RF receiver antenna assembly 84 for the RF reception of the multiplex stream, the demultiplexer 86, and possibly a set of M associated transposition/amplification chains each connected upstream of a different output access.

As a variant, the multichannel subsystem to be calibrated may be the portion of the active antenna 72 in transmission mode, between the output of the GBBF module 74 and the input 94 of the sources of the Tx antenna.

Figure 5:
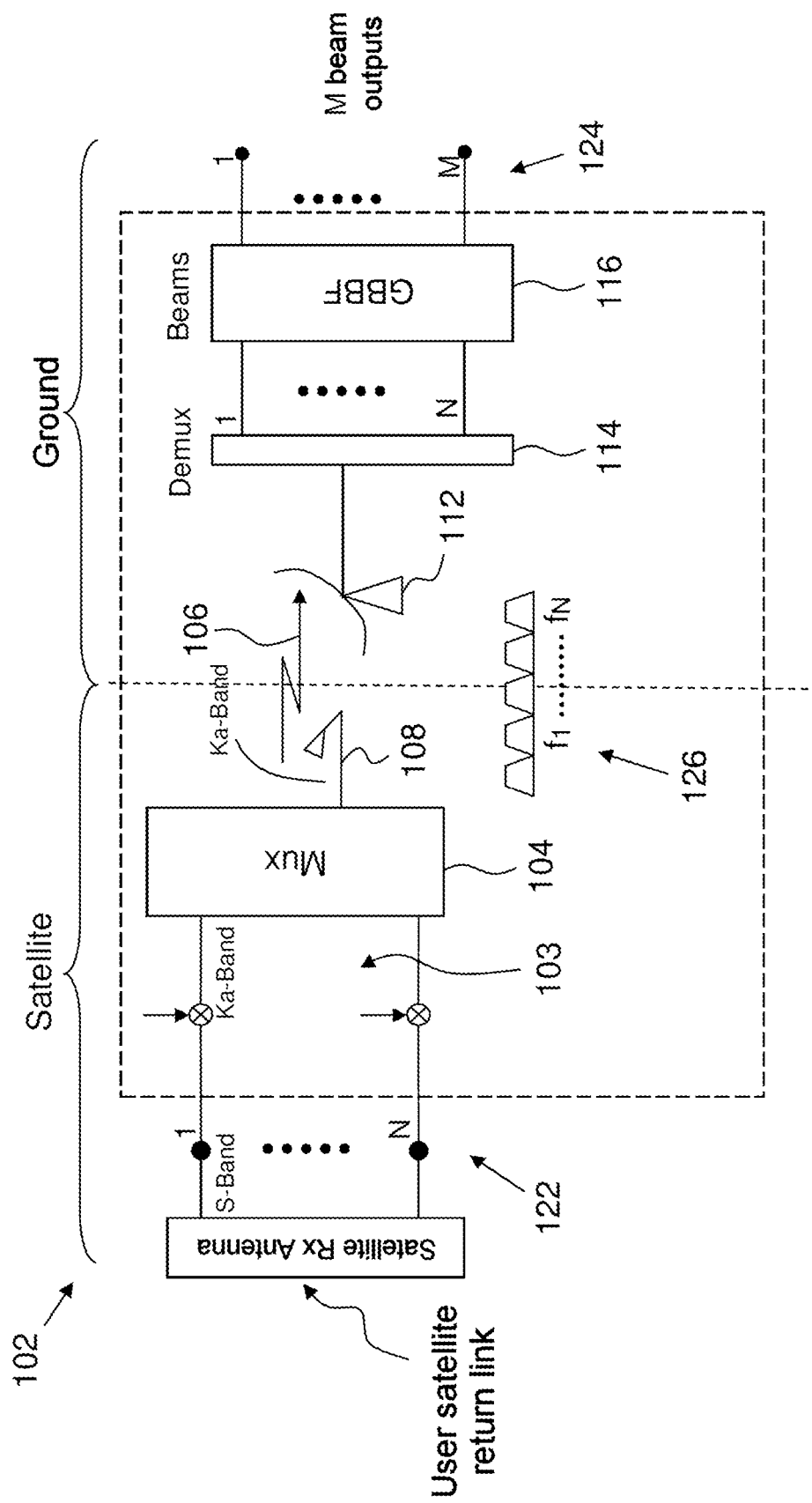
FIG. 5 is a view of a fifth example of a radiofrequency multichannel subsystem, a return-channel active antenna that forms part of a multibeam telecommunications payload distributed on a satellite and a beamforming ground station and is advantageously able to be calibrated by a calibration system and method according to the invention.

According to FIG. 5 and a fifth example of a radiofrequency multichannel subsystem, a multibeam active antenna 102 in reception mode Rx on the return channel forms part of a distributed multibeam telecommunications payload by being distributed on a satellite and a GBBF beamforming ground station, and comprises:

on the satellite, a set 103 of N amplification and/or transposition chains each connected to a different source of the multibeam Rx active antenna, a multiplexer 104 for multiplexing the source channels, which are possibly transposed, into a composite multiplex signal, and a single-beam transmission Tx transmitter antenna assembly 108, configured so as to transmit the stream to the ground station on a high-bit rate RF downlink 106;

on the ground, an RF receiver antenna assembly 112 for receiving the multiplex stream, a demultiplexer 114 for demultiplexing the multiplex stream into source channels, and a GBBF beamforming module 116 for the Rx beams;

on the satellite, a set 122 of N access channels at input for sources of the multibeam active Rx antenna, and, on the ground, a set 124 of M access channels at output, for return channel Rx beams;

a set 126 of at least two internal channels, formed in this case by the set 103 of N amplification and/or transposition chains, the multiplexer 104 for multiplexing the source channels, the transmission Tx satellite RF transmitter antenna assembly 108, the single-beam high-bit rate RF downlink 106, the ground RF receiver antenna assembly 112 for the RF reception of the multiplex stream from the source channels, the demultiplexer 114, and the GBBF beamforming module 116 for the Rx beams.

As a variant, the multichannel subsystem to be calibrated may be the portion of the active antenna 102 in reception mode, between the output 122 of the sources of the Rx antenna and the input of the GBBF beamforming module 116.

Figure 6:
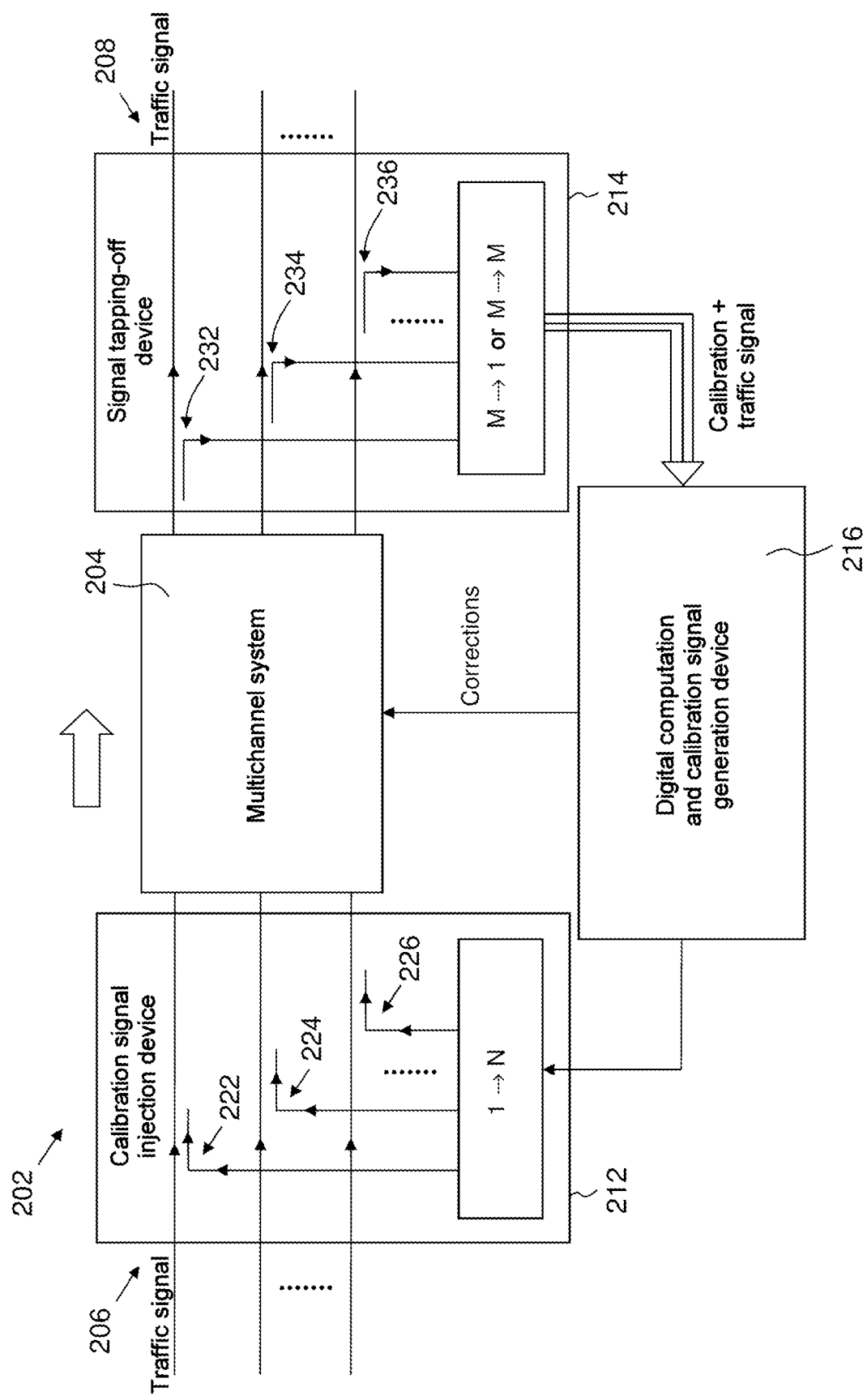
FIG. 6 is a general view of a calibration system according to the invention for calibrating a radiofrequency multichannel subsystem of a telecommunications payload, such as for example those in FIGS. 1 to 5.

According to FIG. 6 and generally speaking, a system 202 for calibrating a radiofrequency multichannel subsystem 204 of a telecommunications payload, such as for example those described in FIGS. 1 to 5, having a first set 206 of N access channels at input and a second set 208 of M access channels at output, comprises:

a first device 212 for injecting an analogue or digital calibration signal at a predetermined injection point of an input access channel or at a plurality of predetermined injection points each associated with a different input access channel; and a second device 214 for tapping off the propagated composite signal, formed by the calibration signal and the traffic signal, at a predetermined tapping-off point of an output access channel or at a plurality of predetermined tapping-off points each associated with a different output access channel; and a third device 216 for generating the calibration signal and for digital computation, formed of one or more electronic computers.

According to FIG. 6 and by way of particular example, each access channel at input includes an injection point, formed in this case by a coupler or a digital adder, the injection points of the three access channels at input illustrated in FIG. 6 being denoted using the numerical references 222, 224, 226. Likewise, each access channel at output includes a point for tapping off the composite calibration and traffic signal, formed for example by a coupler or by a digital acquisition device, the tapping-off points of the three access channels at output illustrated here in FIG. 6 being denoted using the numerical references 232, 234, 236.

The third device 216 for generating the calibration signal and for digital computation is configured so as to:

generate a digital calibration signal corresponding to the digital or analogue version of the calibration signal injected by the first device 212; and extract the calibration signal from the traffic signal and calibration signal multiplex or multiplexes tapped off at the predetermined tapping-off point of an output access channel or at the predetermined tapping-off points each associated with a different output access channel and the generated calibration signal;

estimate amplitude and/or phase differences between the internal channels of the multichannel subsystem on the basis of the calibration signal injected at input, serving as a reference, and of the extracted calibration signal or signals; and define corrections so as to reduce the amplitude and/or phase differences as much as possible, and then apply them by controlling one or more means for correcting said differences when one or more of said differences exceed a predetermined threshold.

Figure 7:
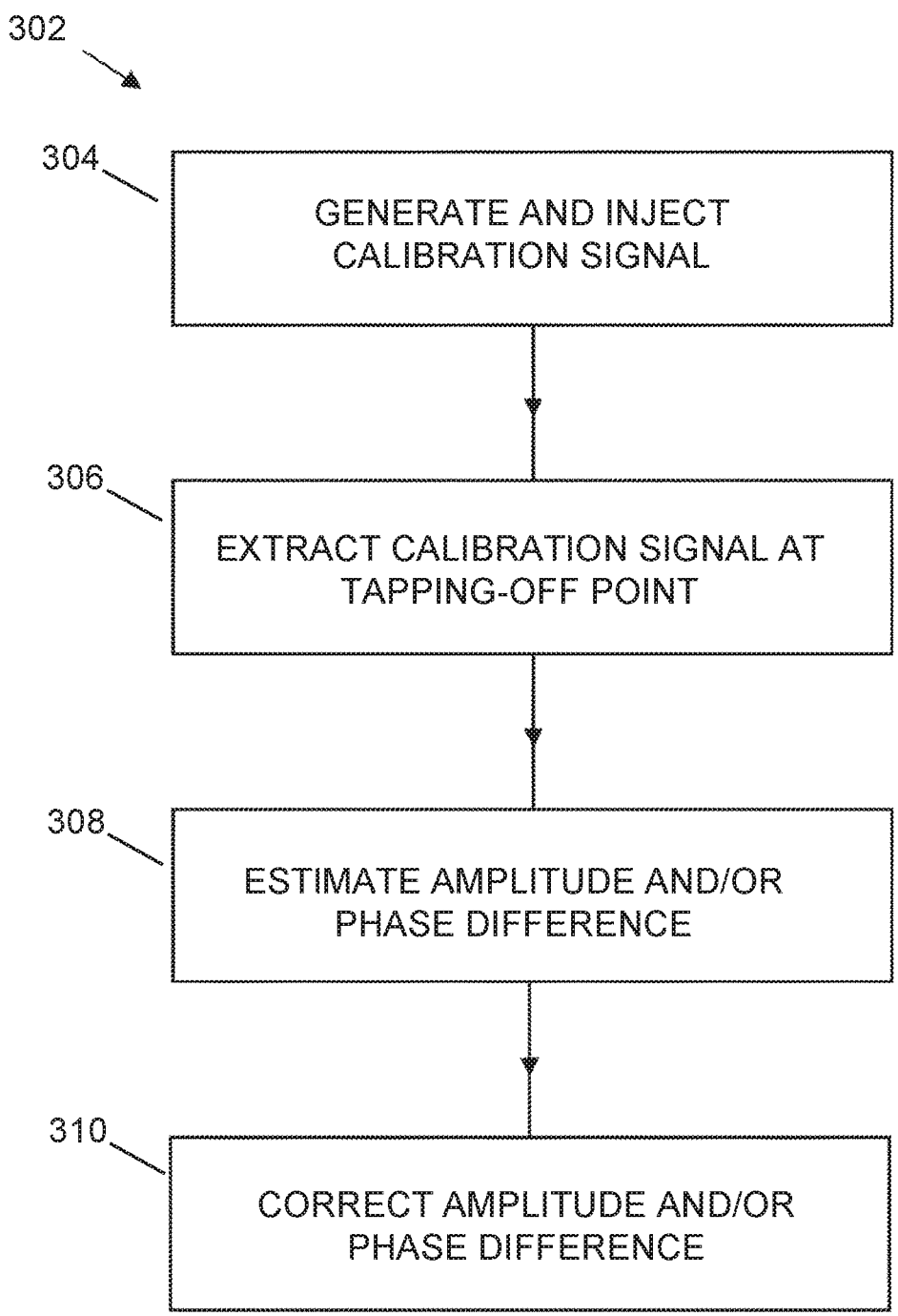
FIG. 7 is a flowchart of a calibration method according to the invention for calibrating a radiofrequency multichannel subsystem of a telecommunications payload, such as for example those in FIGS. 1 to 5.

According to FIG. 7, a method 302 for calibrating a radiofrequency multichannel subsystem of a telecommunications payload comprises a set of steps.

In a first generation and injection step 304, a calibration signal is generated and injected at a predetermined injection point of an input access channel or at a plurality of predetermined points each associated with a different input access channel.

Then, in a second extraction step 306, the calibration signal injected at and propagated to a predetermined tapping-off point of an output access channel or at a plurality of predetermined tapping-off points each associated with a different output access channel is extracted.

Next, in a third estimation step 308, amplitude and/or phase differences between the internal channels of the multichannel subsystem are estimated on the basis of the calibration signal injected at input, serving as a reference, and of the extracted calibration signal or signals.

Then, in a fourth correction step 310, amplitude and/or phase differences are corrected by way of one or more means for correcting said differences when one or more of said differences exceed a predetermined threshold.

The calibration system 202 and method 302 are characterized in that the injected calibration signal is a chirp signal, formed of a chirp or of a sequence of at least two identical chirps.

Generally speaking, a chirp is a signal in which the frequency increases or decreases continuously with time.

Generally speaking, the chirp of an injected chirp calibration signal is a complex signal s(t) of the form $s(t) = a(t)$ ·exp{j·φ(t)}, where a(t)≥0 is a low-pass amplitude whose temporal evolution is slow in comparison with the oscillations of the phase φ(t).

It should be noted that the fourth step 310 may be executed directly on board the satellite or on the ground.

According to a first embodiment, the first step 304 consists in generating and injecting one or more calibration signals at a predetermined injection point of an input access channel or at a plurality of predetermined points each associated with a different input access channel, the injected calibration signals being chirp signals having the same bandwidth and centred on one and the same centre frequency.

According to a second embodiment, the first step 304 consists in generating and injecting calibration signals at a predetermined injection point of an input access channel or at a plurality of predetermined points each associated with a different input access channel, the injected calibration signals being chirp signals having the same bandwidth and centred on different centre frequencies that are distributed evenly over the communication band of the traffic carriers.

During the third step 308, the method for estimating the amplitude and/or phase differences between the internal channels of the multichannel subsystem on the basis of the calibration signal injected at input, serving as a reference, and of the signal or signals tapped off at output uses a second-type algorithm based on correlation-matched filtering.

Figure 8:
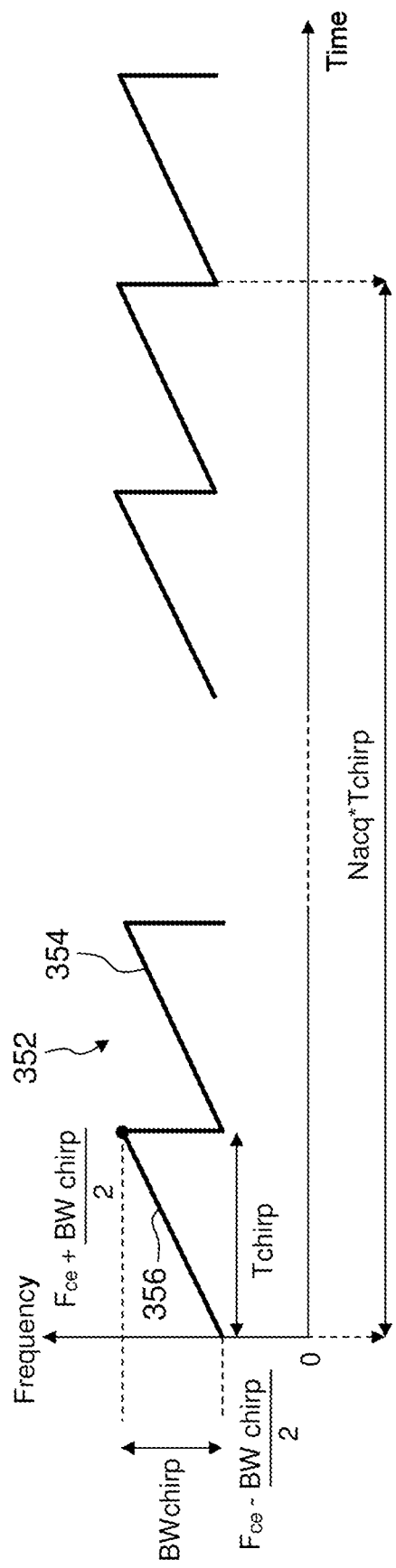
FIG. 8 is a general view of the temporal evolution of the frequency of an injected calibration signal corresponding to one preferred embodiment of the invention.

According to FIG. 8 and with preference, the injected calibration signal is a periodized complex linear chirp signal s(t) of the form s(t)=A·exp{j·φ(t)}, the instantaneous frequency f(t), defined by the equations:

$$f(t) = \frac{1}{2\pi} * \frac{d\varphi(t)}{dt} = F1 + \frac{F2 - F1}{Tchirp} * t$$

evolving in line with a sawtooth periodic function 354 repeating, in a time period Tchirp, a frequency ramp pattern 356 varying linearly between a first frequency value F1 and a second frequency value F2.

The first frequency value F1 is equal to $$F_{ce} - \frac{BW_{chirp}}{2}$$

and the second frequency value F2 is equal to $$F_{ce} + \frac{BW_{chirp}}{2},$$

$F_{ce}$ denoting a predetermined centre frequency and $BW_{chirp}$ denoting the bandwidth of the chirp.

For each tapping-off point of the calibration signal, the tapping off and the processing of the calibration signal relates to a sequence of a predetermined number Nacq of consecutive patterns or chirps each having a frequency ramp form. The acquisition period Tacq of the calibration signal is thus equal to Nacq*Tchirp.

Figure 9:
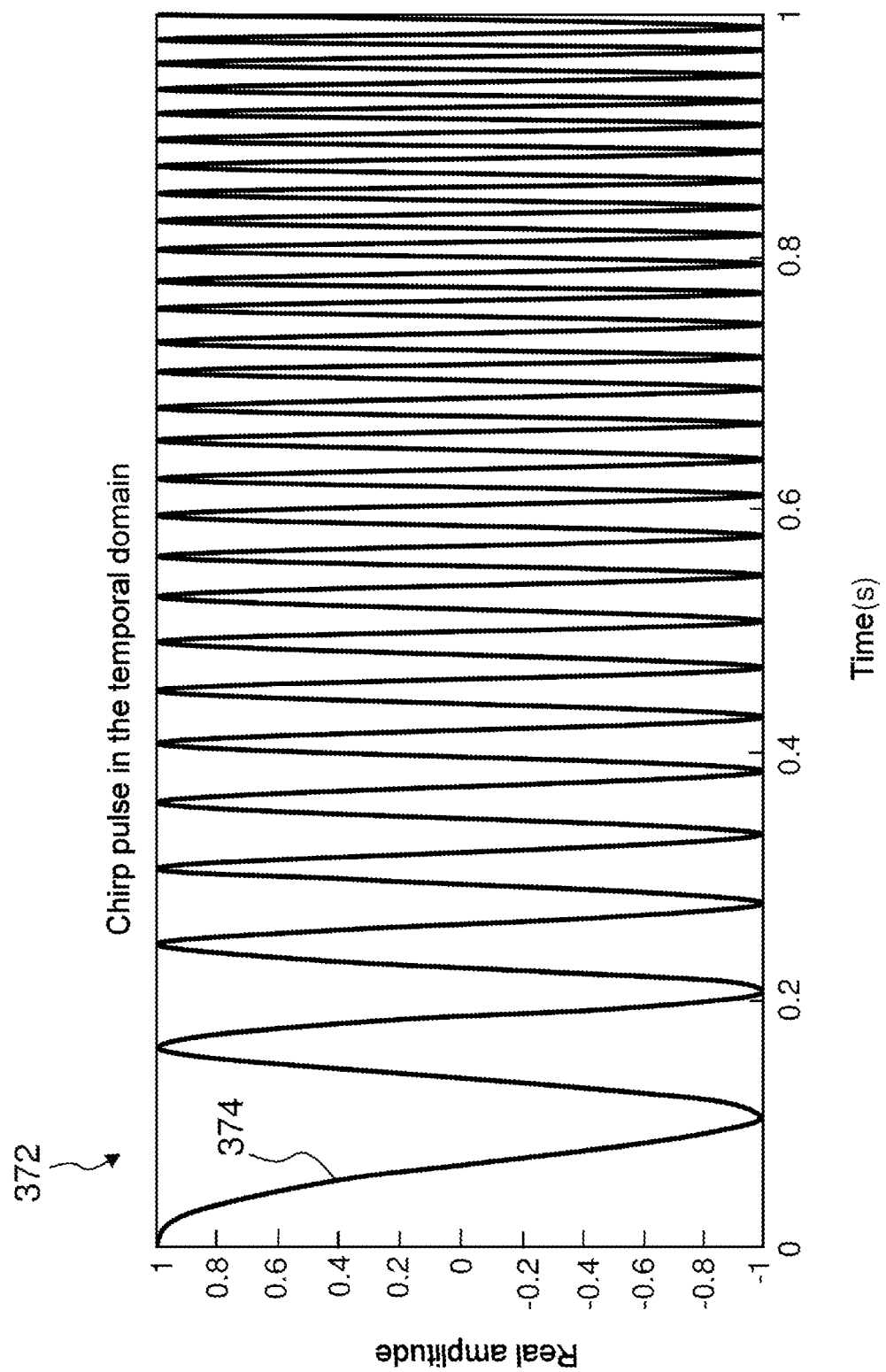
FIG. 9 is a view of an example of the temporal evolution of the real part of the amplitude of a pattern of an injected calibration signal corresponding to one example of the preferred embodiment of the injected calibration signal according to the invention, described in FIG. 8.

According to FIG. 9, a temporal evolution 372 of the real amplitude 374 of s(t) of a chirp pattern of an injected chirp calibration signal before processing corresponds to a typical example of the preferred embodiment of the injected calibration signal according to the invention, described in FIG. 8.

Figure 10:
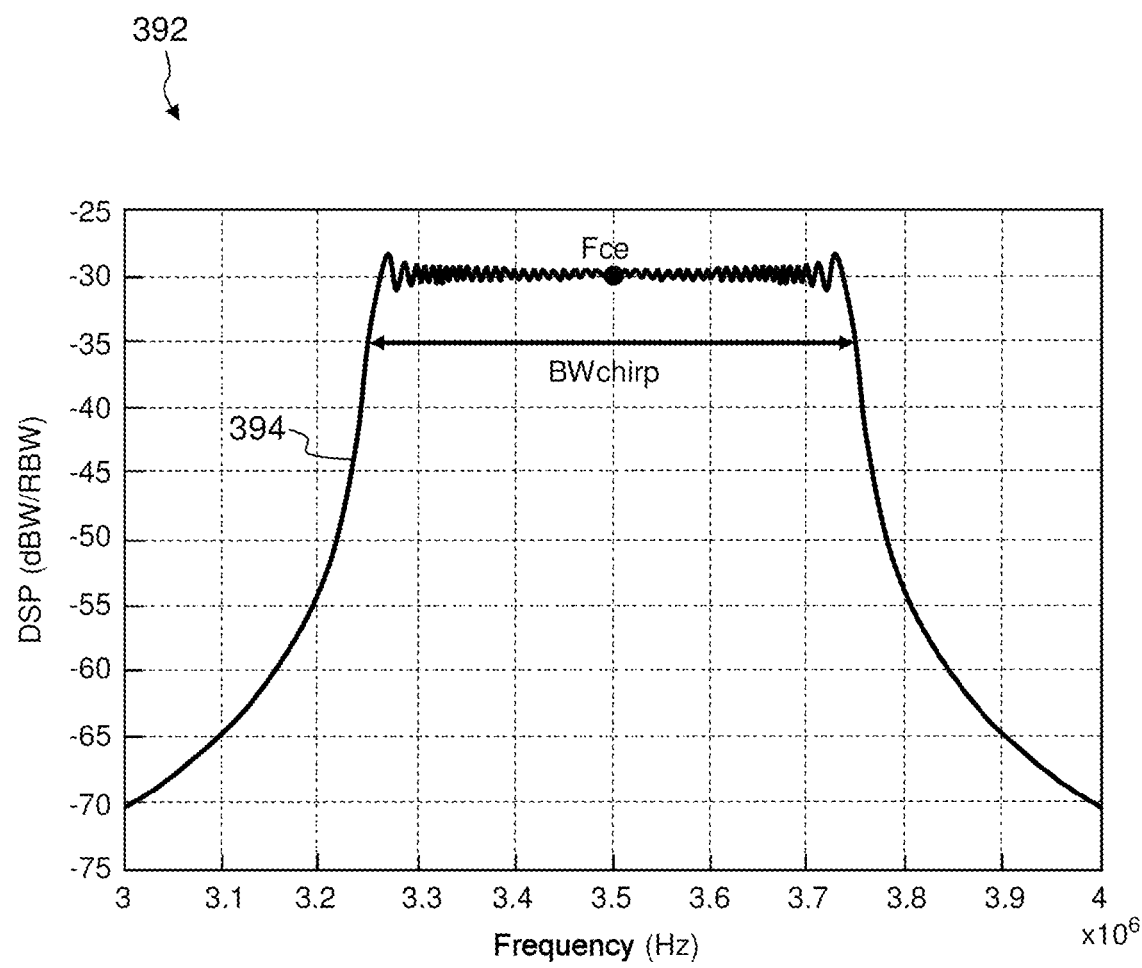
FIG. 10 is a view of an example of a typical spectrum of a calibration signal having the frequency evolution form described in FIG. 8.

According to FIG. 10, an example of a spectrum 392 of a chirp signal having the frequency evolution form described in FIG. 8 and a bandwidth Bchirp equal to 500 kHz is illustrated at a centre frequency after transposition Fce equal to 3.5 MHz. The spectrum 392 describes the variation 394 in the power spectral density of the signal, expressed in dBW/resolution band of the spectral analyser, as a function of the frequency expressed in MHz.

As a result, by virtue of the particular chirp waveform used by the calibration signal, the frequency position of the injected chirp calibration signal is able to be independent of the frequency plan of the traffic carriers without this impacting the calibration performance in terms of accuracy of the estimated inter-channel amplitude/phase differences between internal channels or degrading the communication performance of the traffic carriers.

Figure 11:
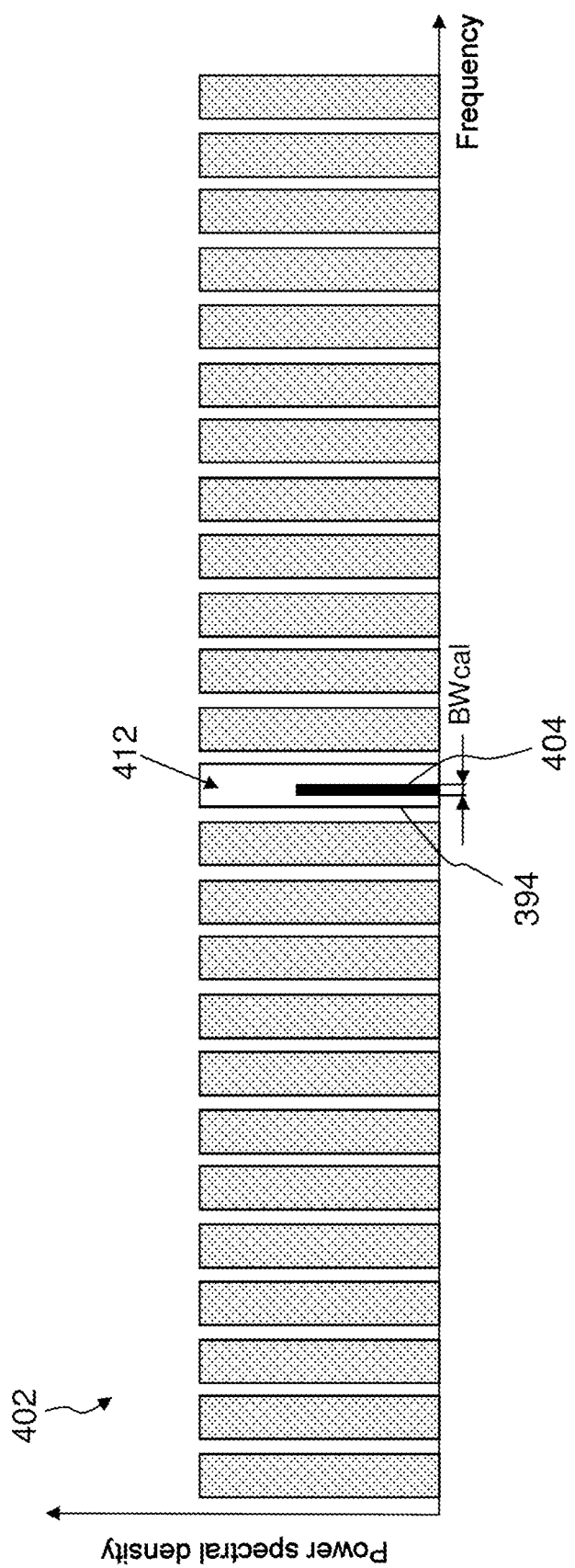
FIG. 11 is a view of an example of the spectrum used by traffic carriers of a telecommunications payload in which the spectrum of the calibration signal is embedded entirely within the spectrum of a carrier with an interference power that is sufficiently negligible so as not to disrupt the traffic on this carrier while at the same time allowing accurate calibration and estimation of the inter-channel amplitude/phase disparities.

According to FIG. 11 and a first particular configuration of the frequency plan 402 of the traffic carriers, virtually all of the power of the calibration signal 394 is concentrated in the main lobe 404 of said injected chirp calibration signal, the main lobe having a bandwidth $BW_{chirp}$, being contained entirely within the band of a traffic carrier 412 and interfering with this traffic carrier 412 with a relative power level that may be very low, for example less than or equal to −30 dB/$BW_{chirp}$ or −30 dB+10 log(BWchirp/Rs) in the Rs band of the symbol timing of the traffic carrier. After extraction, the signal-to-noise ratio of the calibration signal reaches a sufficiently high level, for example 26 dB, for guaranteeing good calibration performance, that is to say for performing accurate estimations of the inter-channel amplitude/phase differences, for example for obtaining dispersions in the differences of the order of 0.5 degrees in sigma phase and 0.04 dB in sigma amplitude, without degrading the communication performance of the traffic carrier.

As a variant and according to a second particular configuration of the frequency plan of the traffic carriers, the spectrum of the injected chirp calibration signal contains a main lobe that has a bandwidth $B_{chirp}$ and that is contained partly within the band of a traffic carrier with a relative power level adapted so as to guarantee good calibration performance without degrading the communication performance of the traffic carrier.

As a variant and according to a third particular configuration of the frequency plan of the traffic carriers, the spectrum of the injected chirp calibration signal contains a main lobe that has a bandwidth $B_{chirp}$ and that is contained entirely within a guard band of the traffic carriers.

Figure 12:
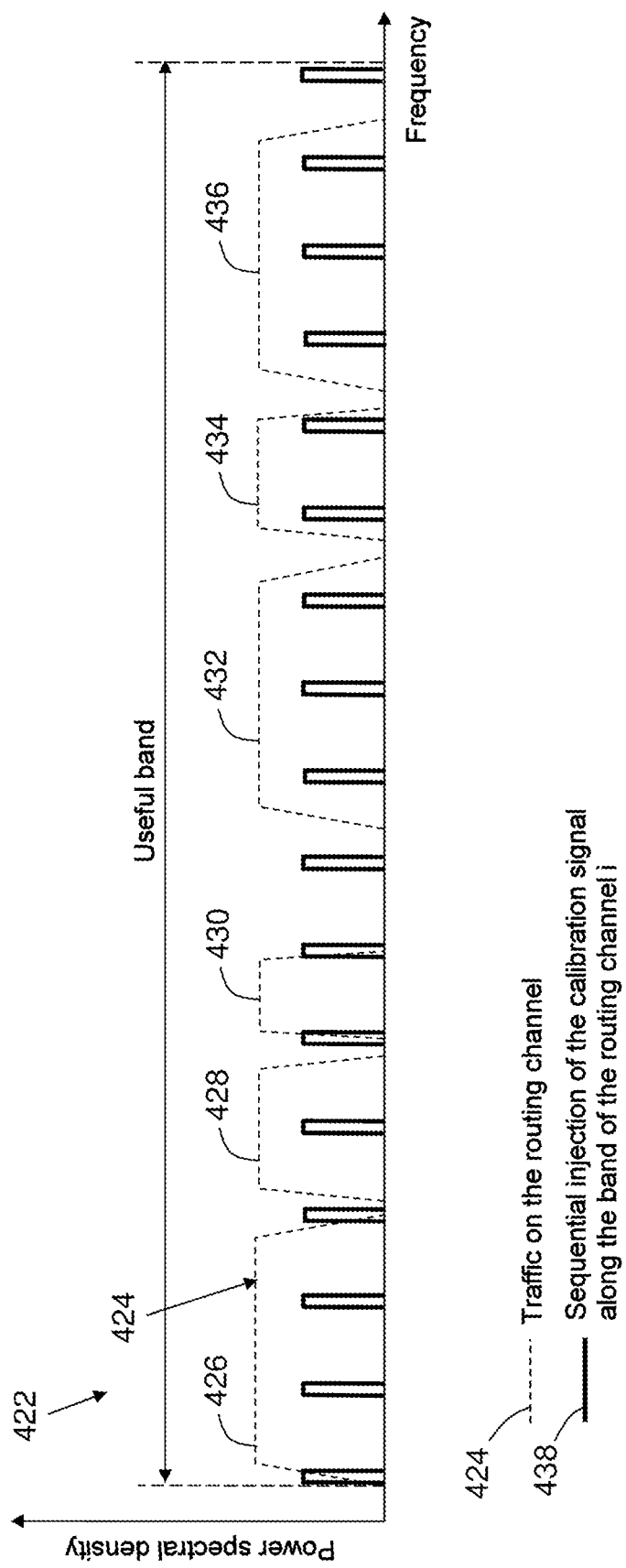
FIG. 12 is a view of another example of the spectrum used by traffic signals transiting on a transmission channel i of the telecommunications payload and of the spectrum used by the calibration signal when it is injected sequentially along the useful band of the transmission channel i.

According to FIG. 12 and an example of a frequency plan 422 of a transmission channel i, the routed traffic 424 is shown by dashed lines and comprises a set of carriers 426, 428, 430, 432, 434, 436 loaded at various parts of the spectrum. In the useful band of the transmission channel i, the calibration signal 438, shown in unbroken lines, is in this case injected sequentially at different instants along the spectral band of the channel at corresponding evenly spaced frequency intervals. In a manner that is not planned with respect to the frequency plan of the traffic, the injected calibration signal may fall inside or straddle or fall outside a loaded carrier.

Figure 13:
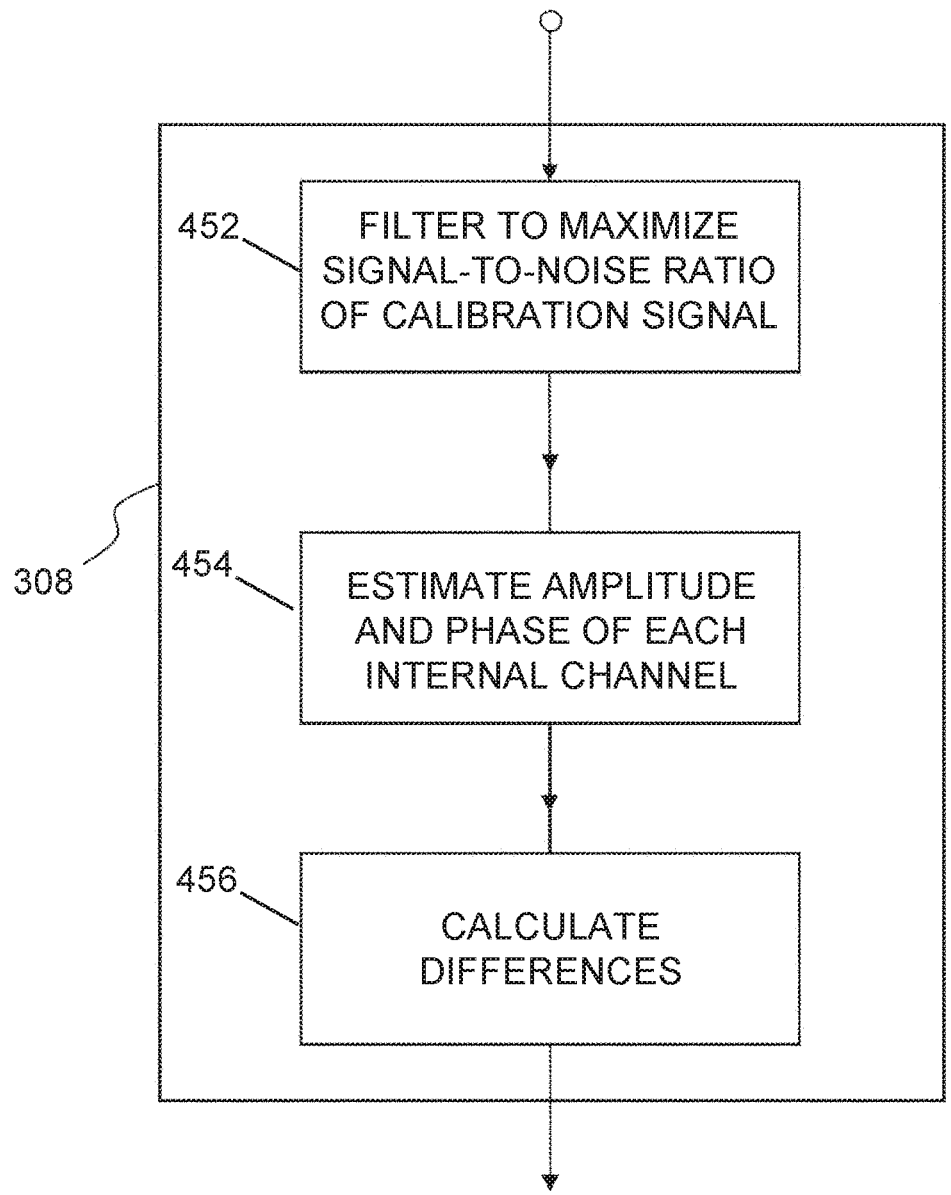
FIG. 13 is a detailed flowchart of one embodiment of the calibration signal extraction step of the calibration method according to the invention of FIG. 7.

According to FIG. 13 and the preferred mode of the invention described in FIG. 8, the third step 308, in which the amplitude ΔA and/or phase ΔPhi differences between the internal channels of the multichannel subsystem are estimated on the basis of the calibration signal injected at input, serving as a reference, and of the signal or signals tapped off at output, comprises first, second and third sub-steps 452, 454, 456.

In the first sub-step 452, for each internal channel, the calibration signal in the traffic signal is extracted by way of matched filtering that maximizes the signal-to-noise ratio of the calibration signal and that maximizes a correlation function between the samples of the signal tapped off at output and the samples of the calibration signal as a reference replica.

Then, in the second sub-step 454, the amplitude A and the phase Phi of each internal channel are estimated on the basis of the correlation maximum that gives the complex gain and propagation delay of the calibration signal from its digital injection point to the output of the matched filtering.

Next, in the third sub-step 456, the differences ΔA/ΔPhi of the internal channels in relation to a predetermined reference channel are calculated on the basis of the estimated amplitude and phase A/Phi of each internal channel.

Figure 14:
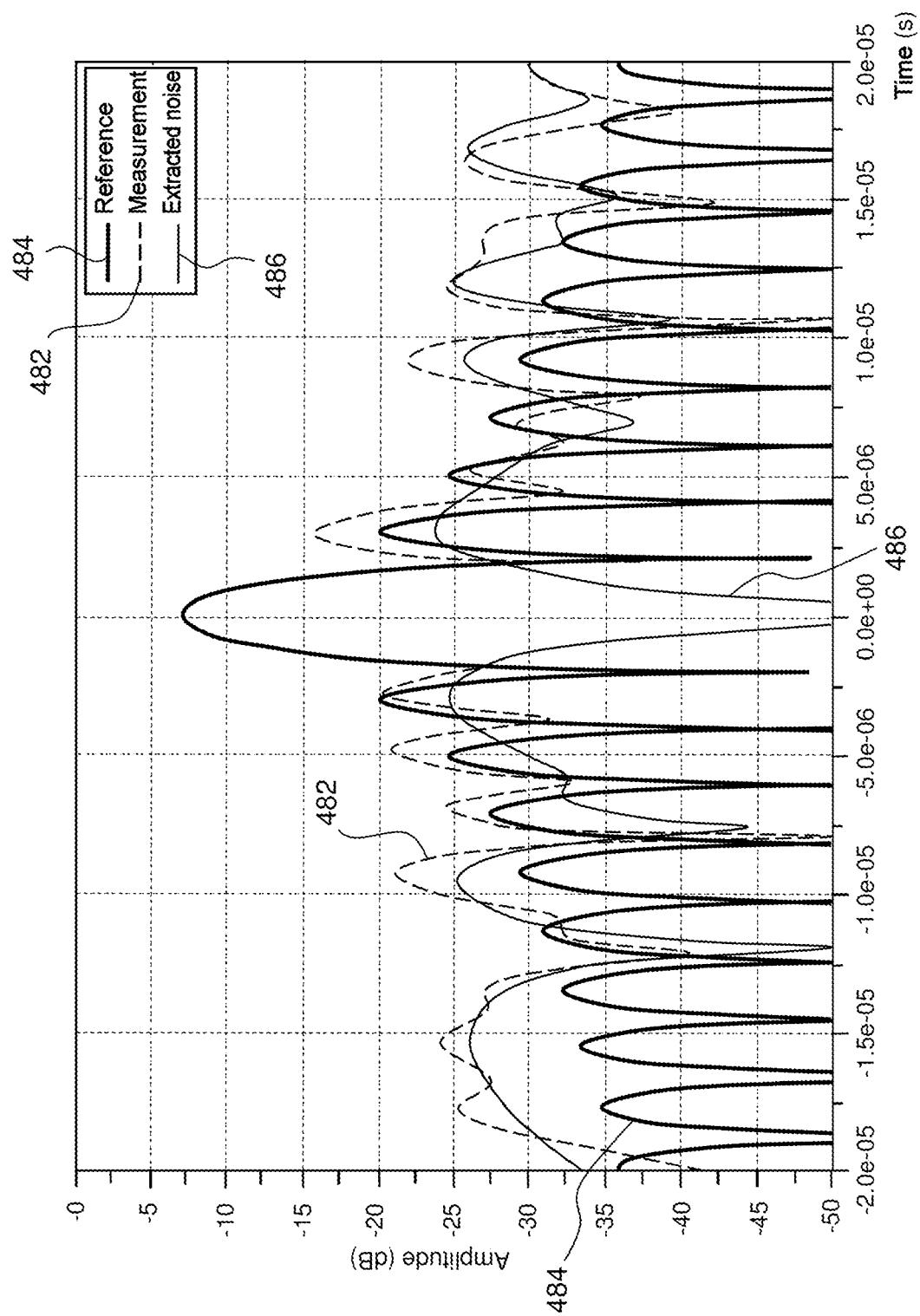
FIG. 14 is a comparative view of the correlation function, maximized by matched filtering of a reference chirp calibration signal and of an extracted chirp calibration signal using the waveform whose characteristic examples are described in FIGS. 8 to 10.

According to FIG. 14, a measured calibration signal, illustrated by a first curve 482, is extracted from the traffic signal in the first sub-step 452 of the third step 308 by way of a matched filtering technique, making it possible to maximize the signal-to-noise ratio of the complex correlated signal C(t) between the samples of the tapped-off output signal Sp(t) and the samples of the input calibration signal E(t), C(t) being expressed by the following equation:

$$C(t) = Sp(t) \otimes E^*(-t)$$

A second curve 484 illustrates the maximized correlation in terms of signal-to-noise ratio of the complex correlated signal of the reference calibration signal, serving as a replica with itself.

A third curve 486 illustrates the noise extracted by way of the matched filtering.

Extracting the tapped-off calibration signal by way of matched filtering allows injection of a calibration signal at a very low level, for example −30 dB in relation to the power of the traffic signal interfering with the band of the calibration signal, and makes it possible to extract the chirp signal embedded in the loaded traffic carrier, with maximum processing gain, so as to obtain an objective positive signal-to-noise ratio of the calibration signal, which guarantees error estimation accuracy.

This objective signal-to-noise ratio of the calibration signal depends on the injection level in relation to that of the traffic carrier in the band of the calibration signal, on the features of the chirp signal (band and duration), and on the number of acquisitions Nacq for each channel allowing temporal averaging.

At the same time, as the injection level of the calibration signal is very low, transmission of the telecommunication signal on the traffic carrier is integral, with degradation of the bit error rate BER and of its signal-to-noise ratio SNR in the band of the useful carrier within the measurement accuracies of measurement apparatuses.

It should be noted that the injection of a calibration signal at an injection point may be implemented on an access channel at input of the payload, digitally via one or more digital-to-analogue converters (DAC) of a digital transparent processor DTP or digital non-transparent processor, or in analogue by way of a coaxial coupler for example.

It should be noted that the signal tapped off at a point for tapping off and extracting the injected and propagated calibration signal is in reality a composite signal including part or all of a loaded traffic carrier and all of the calibration signal, and that tapping off of the digital signal may be implemented on the access channel at output of the payload, digitally after the demultiplexer function of a digital transparent or non-transparent processor, or in analogue by way of a coaxial coupler for example, and then digitized by way of an acquisition chain, which may be a chain of the processor or an additional chain.

It should be noted that, if calibration is necessary over a wide frequency band, for example 2 GHz in the Ku band, the steps of injecting the calibration signal, of extracting the calibration signal and of estimating the inter-channel errors are performed sequentially, by sequentially placing the calibration signal at a plurality of frequency positions in the frequency band or frequency sub-bands of the frequency plan of the traffic carriers.

The calibration method and system according to the invention, which are described above, allow a multichannel subsystem of an embedded telecommunications payload to perform calibration on board the satellite so as to guarantee the performance of said multichannel subsystem over the lifetime of the satellite, in operational conditions without interrupting telecommunication traffic, and without operational constraints on the frequency plan of the traffic carriers.

Little additional hardware needs to be inserted on board the satellite, the list of this hardware comprising: coaxial couplers if these are not provided in the payload, an array of RF switches in transmission mode Tx, an RF splitter in reception mode Rx, a transposition frequency conversion chain (one for an RF/FI conversion in transmission mode Tx and one for FI/RF in reception mode Rx) and an RF harness. The digital processing of the signals, the error estimation and the definition of the corrections may be implemented on board the satellite in an apparatus that already exists for the payload, depending on the architecture thereof, or in an apparatus dedicated solely to the calibration function.

The multichannel subsystem of the embedded payload may be an active or semi-active antenna.

The multichannel subsystem of the embedded payload may be a multiport amplification device MPA by way of which frequency reuse carriers are transmitted, due to the fact that it is the signal-to-noise ratio of the calibration signal and not the signal-to-noise ratio of a traffic carrier that will govern the correct estimation of the amplitude and phase errors. Specifically, on an output port of the MPA on which a traffic carrier and the interfered-with calibration signal recombine, the aggregated isolation leakages of the other co-frequency traffic carriers will be of second order with respect to the power of the carrier interfering with the calibration signal. In this case, the calibration system requires only one analogue-to-digital converter ADC to digitize the composite signal per tapping-off point at output of the multichannel subsystem, since the reference digital calibration signal is generated on board and there is no need to acquire it in parallel with the acquisition of the tapping-off signal at output.

As a variant, the calibration method and system according to the invention, which are described above, allow a multichannel subsystem of a telecommunications payload, forming an active antenna in transmission mode Tx or in reception mode Rx with ground-based beamforming GBBF and distributed on a satellite and a ground station, to perform distributed calibration on the satellite and the ground station so as to guarantee the performance of said multichannel subsystem over the lifetime of the satellite, in operational conditions without interrupting telecommunications traffic, and without operational constraints on the frequency plan of the traffic carriers.

It should be noted that the calibration method and the calibration system may be limited in terms of their use to simple monitoring of the multichannel subsystem, without applying corrections.

It should be noted that the calibration method and the calibration system may also serve to align the channels of the multichannel subsystems in the assembly, integration and test phase AIT.

The invention claimed is:

1. A method for calibrating a radiofrequency multichannel subsystem of a telecommunications payload, the payload being contained entirely within and embedded on board a satellite or distributed on a satellite and a beamforming ground station, the method taking place while the payload is operating, the multichannel subsystem comprising: a first integer (N) of access channels at input being greater than or equal to 2, and a second integer (M) of access channels at output being greater than or equal to 1, and a set of at least two internal channels, each formed of a chain of radiofrequency components having the same architecture, either distributing an input signal supplied by one of the access channels at input to a plurality of the access channels at output, or concentrating a plurality of input signals supplied respectively by a plurality of the access channels at input to one of the access channels at output, the method comprising:

generating and injecting a calibration signal at a predetermined injection point of one of the access channel at input or at a plurality of predetermined points each associated with a different one of the access channels at input, wherein the calibration signal is a chirp signal formed of a chirp or of a sequence of at least two identical chirps;

extracting the injected and propagated calibration signal at a predetermined tapping-off point of one of the access channels at output or at a plurality of predetermined tapping-off points each associated with a different one of the access channels at output;

estimating an amplitude and/or phase difference between the internal channels of the multichannel subsystem on the basis of the calibration signal injected at input, serving as a reference, and of the extracted calibration signal or signals; and correcting the amplitude and/or phase difference by way of one or more means for correcting said differences when one or more of said differences exceed a predetermined threshold.

2. The method for calibrating a radiofrequency multichannel subsystem according to claim 1, wherein each chirp of the injected chirp calibration signal is a complex signal $s(t)=a(t)\cdot\exp\{j\cdot\varphi(t)\}$, where $a(t)\geq 0$ is a low-pass amplitude whose temporal evolution is slow in comparison with the oscillations of the phase $\varphi(t)$.

3. The method for calibrating a radiofrequency multichannel subsystem according to claim 1, wherein the injected calibration signal is a periodized complex linear chirp signal $s(t)=a(t)\cdot\exp\{j\cdot\varphi(t)\}$, the instantaneous frequency:

$$f(t) = \frac{1}{2\pi} * \frac{d\varphi(t)}{dt} = F1 + \frac{F2-F1}{T1} * t$$

evolving in line with a sawtooth periodic function repeating, in a time period (T1), a frequency ramp pattern varying linearly between a first frequency value (F1) and a second frequency value (F2), the first frequency value (F1) being equal to $$F_{ce} - \frac{BW_{chirp}}{2}$$

and the second frequency value F2 being equal to $$F_{ce} + \frac{BW_{chirp}}{2},$$

$F_{ce}$ denoting a predetermined centre frequency and $BW_{chirp}$ denoting the bandwidth of the chirp.

4. The method for calibrating a radiofrequency multichannel subsystem according to claim 1, wherein a frequency position of the injected chirp calibration signal is independent of a frequency plan of traffic carriers.

5. The method for calibrating a radiofrequency multichannel subsystem according to claim 1, wherein the spectrum of the injected chirp calibration signal contains a main lobe that has a bandwidth ($B_{chirp}$) and that is contained entirely within a band of a traffic carrier.

6. The method for calibrating a radiofrequency multichannel subsystem according to claim 1, wherein the spectrum of the injected chirp calibration signal contains a main lobe that has a bandwidth ($B_{chirp}$) and that is contained partly within a band of a traffic carrier.

7. The method for calibrating a radiofrequency multichannel subsystem according to claim 1, wherein the spectrum of the injected chirp calibration signal contains a main lobe that has a bandwidth ($B_{chirp}$) and that is contained entirely within a guard band of traffic carriers.

8. The method for calibrating a radiofrequency multichannel subsystem according to claim 1, wherein generating and injecting calibration signals is at a predetermined injection point of one of the access channels at input or at a plurality of predetermined points each associated with a different one of the access channels at input, and the injected calibration signal includes a plurality of chirp signals having the same bandwidth and centred on different centre frequencies that are distributed evenly over a communication band of traffic carriers.

9. The method for calibrating a radiofrequency multichannel subsystem according to claim 1, wherein the estimating the amplitude and/or phase differences between the internal channels of the multichannel subsystem on the basis of the calibration signal injected at input serving as a reference, and of the signal or signals tapped off at output uses a second-type algorithm based on correlation-matched filtering.

10. The method for calibrating a radiofrequency multichannel subsystem according to claim 9, wherein the injected calibration signal is a periodized complex linear chirp signal $s(t)=A\cdot\exp\{j\cdot\varphi(t)\}$ the instantaneous frequency f(t), expressed by the equations:

$$f(t) = \frac{1}{2\pi} * \frac{d\varphi(t)}{dt} = F1 + \frac{F2-F1}{T1} * t$$

evolving in line with a sawtooth periodic function repeating, in a time period (T1), a frequency ramp pattern varying linearly between a first frequency value (F1)

and a second frequency value (F2),
the first frequency value (F1) being equal to $$F_{ce} - \frac{BW_{chirp}}{2}$$

and the second frequency value (F2) being equal to $$F_{ce} + \frac{BW_{chirp}}{2},$$

$F_{ce}$ denoting a predetermined centre frequency and $BW_{chirp}$ denoting the bandwidth of the chirp; and the estimating of the amplitude ΔA and/or phase ΔPhi differences between the internal channels of the multichannel subsystem is on the basis of the calibration signal injected at input, serving as a reference, and of the signal or signals tapped off at output, by extracting, for each internal channel, the calibration signal from the traffic signal by way of matched filtering that maximizes a signal-to-noise ratio of the calibration signal and that maximizes a correlation function between samples of the signal tapped off at output and samples of the calibration signal as a reference replica, and by estimating the amplitude A and the phase Phi of each internal channel on the basis of the correlation maximum that gives the complex gain and propagation delay of the calibration signal from its digital injection point to the output of the matched filtering; and then by calculating the differences of the internal channels in relation to a predetermined reference channel on the basis of the estimated amplitude A and phase Phi of each channel.

11. The method for calibrating a radiofrequency multichannel subsystem according to claim 1, wherein when the telecommunication payload is contained entirely within and embedded on board a satellite, the radiofrequency multichannel system is a multi-port amplifier (MPA) including two Butler matrices, with the digital or analogue input Butler matrix, without a beamforming network (BFN), integrated into an active or inactive antenna; or a multi-port amplifier (MPA with a beamforming network (BFN) at digital or analogue input and a Butler matrix at output, integrated into an active or inactive antenna; or a multiport parallelized amplifier (MPPA) including parallelized amplifiers inside an MPA, integrated into an active or inactive antenna; or a multimatrix semi-active antenna with a reflector, with or without MPA; or a direct radiation array (DRA) active antenna or an array-fed shaped reflector antenna (AFSRA) or a focal array-fed reflector (FAFR) antenna with an analogue or digital (BFN); or an on-board function requiring amplitude matching/phase matching of a plurality of channels with one another; and when the telecommunication payload is distributed on a satellite and a beamforming ground station, the radiofrequency multichannel system is a satellite active antenna in reception mode Rx with ground-based beamforming (GBBF), or a satellite active antenna in transmission mode (Tx) with ground-based beamforming (GBBF) with or without an MPA or MPPA function entirely on board or with or without an MPA or MPPA function whose input Butler matrix is distributed on the ground.

12. The method for calibrating a radiofrequency multichannel subsystem according to claim 1, wherein correcting the amplitude and/or phase difference is executed directly on board the satellite or on the ground.

13. A system for calibrating a radiofrequency multichannel subsystem of a telecommunications payload, the payload being contained entirely within and embedded on board a satellite or distributed on a satellite and a beamforming ground station, the calibration taking place while the payload is operating, the multichannel subsystem comprising: a first integer (N) of access channels at input being greater than or equal to 2, and a second integer (M) of access channels at output being greater than or equal to 2, and a set of at least two internal channels, each formed of a chain of radiofrequency components having the same architecture, either distributing an input signal supplied by one of the access channels at input to a plurality of the access channels at output, or concentrating a plurality of input signals supplied respectively by a plurality of the access channels at input to one of the access channels at output, the calibration system comprising a first device for injecting an analogue or digital calibration signal at a predetermined injection point of an input access channel or at a plurality of predetermined points each associated with a different input access channel;

a second device for tapping off the injected and propagated calibration signal at a predetermined tapping-off point of an output access channel or at a plurality of predetermined tapping-off points each associated with a different output access channel; and a third digital computing device formed of one or more electronic computers and being configured to:

generate a digital calibration signal corresponding to the digital or analogue version of the calibration signal injected by the first device, wherein the injected calibration signal is a chirp signal formed of a chirp or of a sequence of at least two identical chirps;

extract the injected calibration signal from the signal or signals tapped off at the predetermined tapping-off point of an output access channel or at the predetermined tapping-off points each associated with a different output access channel and from the generated calibration signal;

estimate amplitude and/or phase differences between the internal channels of the multichannel subsystem on the basis of the calibration signal injected at input, serving as a reference, and of the extracted calibration signal or signals; and correct amplitude and/or phase differences by controlling one or more means for correcting said differences when one or more of said differences exceed a predetermined threshold.

14. The system for calibrating a radiofrequency multichannel subsystem according to claim 13, wherein the injected calibration signal is a periodized complex linear chirp signal $s(t)=A \cdot \exp\{j \cdot \varphi(t)\}$, the instantaneous frequency f(t), defined by the equations:

$$f(t) = \frac{1}{2\pi} * \frac{d\varphi(t)}{dt} = F1 + \frac{F2-F1}{T1} * t,$$

evolving in line with a sawtooth periodic function repeating, in a time period (T1), a frequency ramp pattern varying linearly between a first frequency value (F1) and a second frequency value (F2), the first frequency value (F1) being equal to $$F_{ce} - \frac{BW_{chirp}}{2}$$

and the second frequency value (F2) being equal to $$F_{ce} + \frac{BW_{chirp}}{2},$$

$F_{ce}$ denoting a predetermined centre frequency and $BW_{chirp}$ denoting the bandwidth of the chirp; and the frequency position of the injected chirp calibration signal is independent of the frequency plan of the traffic carriers.

15. The system for calibrating a radiofrequency multichannel subsystem according to claim 13, wherein the first and second devices are configured so as to generate and inject calibration signals at a predetermined injection point of one of the access channels at input or at a plurality of predetermined points each associated with a different one of the access channels at input, and the injected calibration signals are chirp signals having the same bandwidth and centred on different centre frequencies that are distributed evenly over the communication band of the traffic carriers.

16. The system for calibrating a radiofrequency multichannel subsystem according to claim 13, wherein when the telecommunication payload is contained entirely within and embedded on board a satellite, the radiofrequency multichannel system is a multi-port amplifier (MPA including two Butler matrices, with the digital or analogue input Butler matrix, without a beamforming network (BFN), integrated into an active or inactive antenna; or a multi-port amplifier (MPA with a beamforming network (BFN) at digital or analogue input and a Butler matrix at output, integrated into an active or inactive antenna; or a multiport parallelized amplifier (MPPA) including parallelized amplifiers inside an MPA, integrated into an active or inactive antenna; or what is called a multimatrix semi-active antenna with a reflector, with or without MPA; or a direct radiation array (DRA) active antenna or an array-fed shaped reflector antenna (AFSRA) or a focal array-fed reflector (FAFR) antenna with an analogue or digital BFN; or an on-board function requiring amplitude matching/phase matching of a plurality of channels with one another; and when the telecommunication payload is distributed on a satellite and a beamforming ground station, the radiofrequency multichannel system is a satellite active antenna in reception mode (Rx) with ground-based beamforming (GBBF); or a satellite active antenna in transmission mode (Tx) with ground-based beamforming (GBBF) with or without an MPA or MPPA function entirely on board or with or without an MPA or MPPA function whose input Butler matrix is distributed on the ground.

\* \* \* \* \*